United States Patent
Yun

(10) Patent No.: US 8,102,509 B2
(45) Date of Patent: Jan. 24, 2012

(54) FOCUS AND LEVEL CONTROL METHOD FOR PROJECTION LENS UNIT BY COMPARING INTENSITIES OF MEASUREMENT LIGHT AND REFERENCE LIGHT

(75) Inventor: Jang-hyun Yun, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 414 days.

(21) Appl. No.: 12/420,415

(22) Filed: Apr. 8, 2009

(65) Prior Publication Data

US 2009/0195765 A1    Aug. 6, 2009

Related U.S. Application Data

(62) Division of application No. 11/216,176, filed on Sep. 1, 2005, now Pat. No. 7,535,551.

(30) Foreign Application Priority Data

Sep. 2, 2004   (KR) .................. 10-2004-0069873

(51) Int. Cl.
    *G03B 27/34* (2006.01)
(52) U.S. Cl. ....................................................... 355/55
(58) Field of Classification Search .................. 355/55, 355/53; 356/400
    See application file for complete search history.

(56) References Cited

U.S. PATENT DOCUMENTS 6,417,922 B1   7/2002   Dirksen et al.

FOREIGN PATENT DOCUMENTS

| JP | 5175096 A | 7/1993 |
|---|---|---|
| JP | 2003142373 A | 5/2003 |
| KR | 19960018768 A | 6/1996 |

*Primary Examiner* — Peter B Kim
*Assistant Examiner* — Chia-how Michael Liu
(74) *Attorney, Agent, or Firm* — Volentine & Whitt, PLLC

(57) ABSTRACT

A projection lens unit, related exposure apparatus and control method are disclosed in which measurement light irradiates a semiconductor substrate after passing through lenses in the projection lens unit and reference light irradiates the semiconductor substrate without passing through the lenses in the projection lens unit are used to derive a control signal adapted to adjust the position of the semiconductor substrate under the projection lens unit.

7 Claims, 3 Drawing Sheets

FOCUS AND LEVEL CONTROL METHOD FOR PROJECTION LENS UNIT BY COMPARING INTENSITIES OF MEASUREMENT LIGHT AND REFERENCE LIGHT

CROSS-REFERENCE TO RELATED APPLICATION

This is a divisional of application Ser. No. 11/216,176 filed on Sep. 1, 2005, which is incorporated herein by reference in its entirety.

BACKGROUND OF THE INVENTION

1. Field of the Invention

Embodiments of the invention relate to a projection lens unit adapted for use in an exposure process, as well as an exposure apparatus including the projection lens unit and a control method adapted to focus and level the projection lens unit. More particularly, embodiments of the invention comprise a projection lens having adjustable properties used to focus and level the projection lens unit.

This application claims the benefit of Korean Patent Application No. 10-2004-0069873 filed on Sep. 2, 2004, the disclosure of which is hereby incorporated by reference in its entirety.

2. Description of the Related Art

Continued improvement of semiconductor device performance depends to a great degree on high levels of reliability, increased operating speed and greater integration densities. These demands require continuous improvement in the fabrication technologies used to manufacture semiconductor devices. The fabrication of semiconductor devices is accomplished by a complex sequence of individual processes. Many of these processes are used to form circuit patterns on the surface of a semiconductor substrate. The photolithography and similar fabrication processes used in the formation of circuit patterns often involve an exposure process in which the surface of the semiconductor substrate is selectively illuminated with light emitted from a light source. This process is generally referred to as "projecting." Light is typically projected through a mask or a reticle in order to form a light pattern corresponding to all or part of a circuit pattern to be formed on the semiconductor substrate.

For example, in some exposure processes, a circuit pattern defined by the mask or reticle is transferred to a photosensitive layer (e.g., a photoresist layer) formed on the semiconductor substrate. In these type of exposure processes, it is very important to properly control the focal properties and irradiation angle (e.g., the level of the exposure beam) of the light being projected onto the photoresist layer.

Unfortunately, the mechanical vibrations associated with the rapid manufacture of semiconductors devices in a modern fabrication line make it quite difficult to maintain proper focus and level. In order to ensure the accurate transfer of circuit pattern information from a mask or reticle to a semiconductor substrate, it is first necessary to perform a focus control operation prior to projecting the irradiating light. The focus control operation ensures that the proper portion (i.e., the "shot area") of the semiconductor substrate is irradiated by the exposure beam. After the focus control operation is complete a leveling control operation is performed to ensure a desired angular relationship is established between the semiconductor substrate and the exposure apparatus in relation to the shot area.

A schematic view of the conventional exposure apparatus adapted for use in a conventional exposure process is shown in FIG. 1. The conventional exposure apparatus incorporates a conventional level condition measurement unit includes a light source 10 adapted to generate an exposure beam, a reticle 20, a projection lens 30, a focus and level condition measurement unit (41 and 42), and a semiconductor substrate stage 60.

Within this conventional arrangement, light source 10 provides an exposure beam R10 intended to irradiate semiconductor substrate 50 through reticle 20. Projection lens 30 is adapted to miniaturize and transfer the circuit pattern defined by reticle 20 onto semiconductor substrate 50. Semiconductor substrate 50 is positioned on stage 60 under projection lens 30, and stage 60 is adapted to be moved in the X-, Y- and Z-directions to allow complete exposure of semiconductor substrate 50.

Prior to this exposure process, focus and level condition measurement process(es) must be performed. Unless the focus and level conditions are properly defined the circuit pattern will not be accurately transferred to the semiconductor substrate and the manufacturing yield for the semiconductor device will suffer accordingly. The focus and level condition measurement unit(s), including a light emitting device 41 and a light receiving device 42, generally measure the focus and level conditions associated with semiconductor substrate 50 in relation to projection lens 30.

Light emitting device 41 irradiates semiconductor substrate 50 with a reference light R20a. Light receiving device 42 detects a portion of reference light R20b reflected from semiconductor substrate 50. For example, the focus and level conditions of semiconductor substrate 50 are measured in relation to the reference light R20b reflected from four corners of a current shot area. Using measurement data derived from the reflected reference light R20b, semiconductor substrate stage 60 may be moved in the X-, Y- and Z-directions in order to obtain the desired focus and level conditions for semiconductor substrate 50 relative the current shot area.

As can be seen from the foregoing, the conventional focus and level condition measurement unit functions independent of projection lens 30. Thus, the measured focus and level conditions fail to account for variations (e.g., temperature, humidity, etc.) in the actual inner conditions of projection lens unit 30. Further, potential distortions or particular magnification effects associated with projection lens 30 are not accounted for in the conventional focus and level condition measurements. As a result, the circuit pattern transferred to semiconductor substrate 50 may be deformed despite the conventional efforts to control focus and level conditions.

SUMMARY OF THE INVENTION

Embodiments of the invention provide a projection lens unit that enables the control of focus and level conditions using adjustable lens properties, and/or re-positioning of a subject semiconductor substrate. Such embodiments effectively control, or account for in a control method context, focus errors related to the projection lens due to variations in the inner conditions of the projection lens, and/or profile distortions of the subsequently formed circuit pattern due to distortion and magnification effects associated with the projection lens.

Embodiments of the invention also provide an exposure apparatus including the foregoing projection lens unit, and a related control method.

In one embodiment, a projection lens unit is provided and comprises; a projection lens comprising a first plurality of lenses (N) adapted to project an exposure beam of first wavelength onto a semiconductor substrate; a measurement light emitting unit adapted to provide a measurement light of second wavelength different from the first wavelength, such that the measurement light irradiates the semiconductor substrate after passing through a second plurality of the lenses (M) in the projection lens, where N is greater than or equal to M; a reference light emitting unit adapted to provide a reference light of third wavelength different from the first wavelength, such that the reference light irradiates the semiconductor substrate without passing through the first plurality of lenses in the projection lens to irradiate the semiconductor substrate; a reflected reference light receiving unit receiving a portion of the reference light reflected from the semiconductor substrate; and a reflected measurement light receiving unit receiving a portion of measurement light reflected from the semiconductor substrate.

In related more specific aspects, the ratio of M to N ranges between about ¼ and ¾ and the second and third wavelengths are respectively within the visible light or infrared light spectra.

In another embodiment, an exposure apparatus is provided and comprises; a projection lens comprising a first plurality of lenses (N) adapted to project an exposure beam of first wavelength onto a semiconductor substrate, measurement light emitting unit adapted to provide a measurement light of second wavelength different from the first wavelength, such that the measurement light irradiates the semiconductor substrate after passing through a second plurality of the lenses (M) in the projection lens, where N is greater than or equal to M, a reference light emitting unit adapted to provide a reference light of third wavelength different from the first wavelength, such that the reference light irradiates the semiconductor substrate without passing through the first plurality of lenses in the projection lens to irradiate the semiconductor substrate, a reflected reference light receiving unit receiving a portion of the reference light reflected from the semiconductor substrate, and a reflected measurement light receiving unit receiving a portion of measurement light reflected from the semiconductor substrate. The exposure apparatus also comprises a semiconductor substrate stage holding the semiconductor substrate and adapted to be positioned in relation to a control signal derived from a comparison of the intensity values corresponding to the received portions of the reflected measurement light and the reflected reference light.

In yet another embodiment, a focus and level condition control method adapted for use with a projection lens unit is provided. The projection lens unit comprises a first plurality of lenses (N), and the method comprises; irradiating a semiconductor substrate positioned under the projection lens with a measurement light after passing the measurement light through at least a second plurality of the lenses (M) in the projection lens unit, wherein N is greater than or equal to M, and detecting a portion of the measurement light reflected from the semiconductor substrate as a first value; irradiating the semiconductor substrate with a reference light without passing the reference light through any one of the first plurality of the lenses in the projection lens unit, and detecting a portion of the reference light reflected from the semiconductor substrate as a second value, and comparing the first and second values to generate a control signal adapted to adjust the position of the semiconductor substrate under the projection lens to compensate for focus and level condition errors.

BRIEF DESCRIPTION OF THE DRAWINGS

Embodiments of the invention are described hereafter with reference to the attached drawings. In the drawings like reference numerals refer to like or similar elements throughout the specification. The drawings include.

DESCRIPTION OF EXEMPLARY
EMBODIMENT(S)

Numerous advantages and features associated with embodiments of the invention may be understood upon consideration of the following description of exemplary embodiments with reference to the accompanying drawings. It should, however, be noted that the invention may be implemented in many different forms and should not be construed as being limited to only the exemplary embodiments set forth herein. Rather, exemplary embodiments are provided as teaching examples. The scope of the invention is defined by the claims that follow.

Embodiments of the invention comprise a projection lens unit having an integrated focus and level condition measurement unit. The projection lens unit is associated with exposure equipment irradiating a semiconductor substrate with an exposure beam having a first wavelength. In one embodiment, a focus and level condition measurement unit uses dual light beams; one beam having a second wavelength different from the first wavelength that passes through the projection lens of the projection lens unit, and another beam having a third wavelength, which is the same as or different from the second wavelength, that does not pass through the projection lens. That is, one type of light beam (hereafter "measurement light") adapted for use in the focus and level condition measurement unit is one irradiated through the projection lens and then reflected from a subject semiconductor substrate. Another type of light beam (hereafter "reference light") adapted for use in the focus and level condition measurement unit is one irradiated through a reference light emitting unit to the semiconductor substrate rather than being irradiated through the projection lens. Both beams may be provided by a measurement light emitting unit.

The reference light reflected from the semiconductor substrate is transmitted to a measurement light receiving unit through a reflected reference light receiving unit, such that the measurement light receiving unit detects the reflected reference light. The focus and level conditions associated with the semiconductor substrate are measured by comparing the intensity of the measured light reflected from the four corners of a current shot area with the intensity of the reference light reflected from the four corners of the current shot area. Using the comparison results, the position of the semiconductor substrate can be accurately controlled relative to the desired focus and level conditions associated with the current shot area. Therefore, since the focus and level conditions associated with the semiconductor substrate account for focus errors associated with the projection lens resulting from the actual inner conditions of the projection lens units, and also account for distortion and/or magnification effects associated with the projection lens unit, the focus and level conditions may be effectively controlled.

Figure 1:
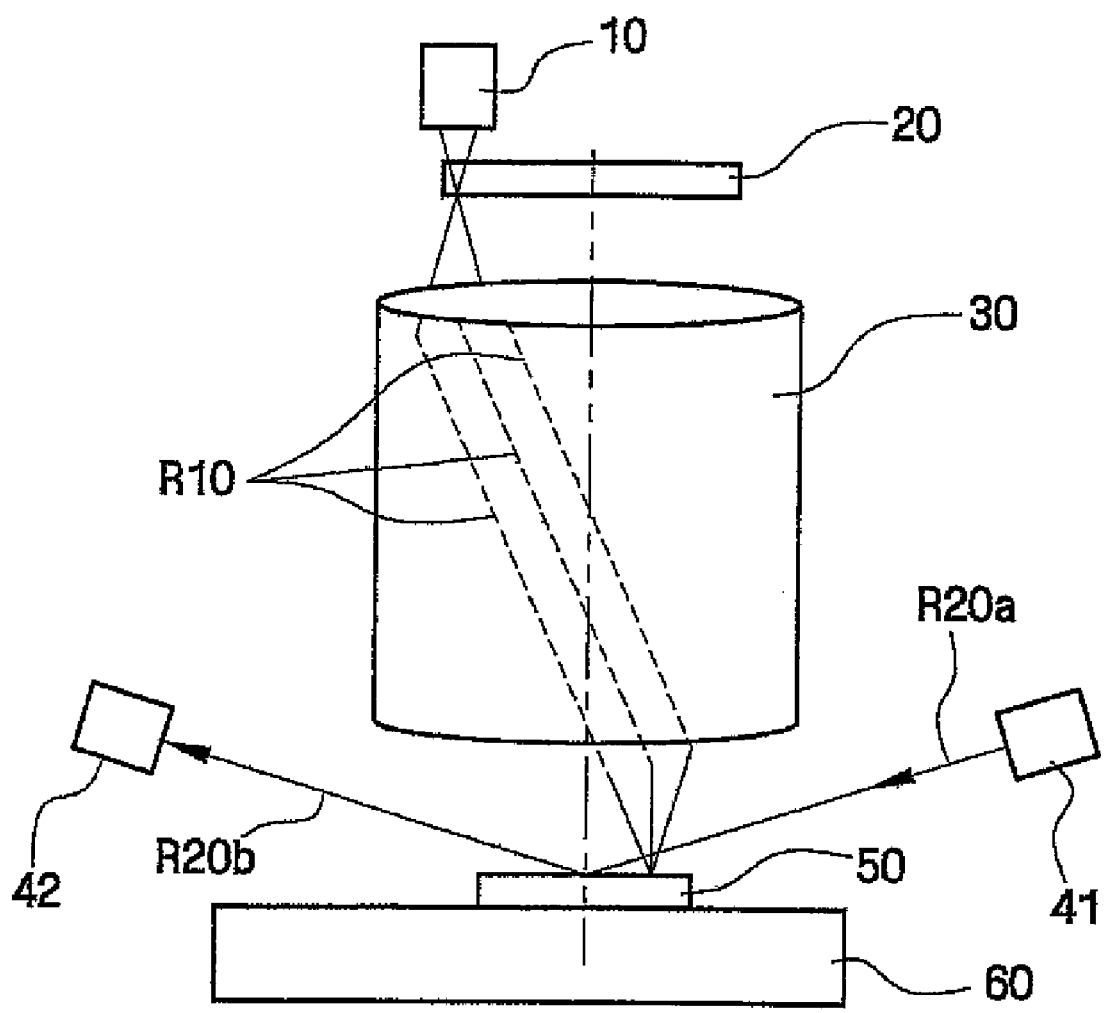
FIG. 1 is a schematic sectional view showing an exposure apparatus used in a conventional exposure process.
Figure 2:
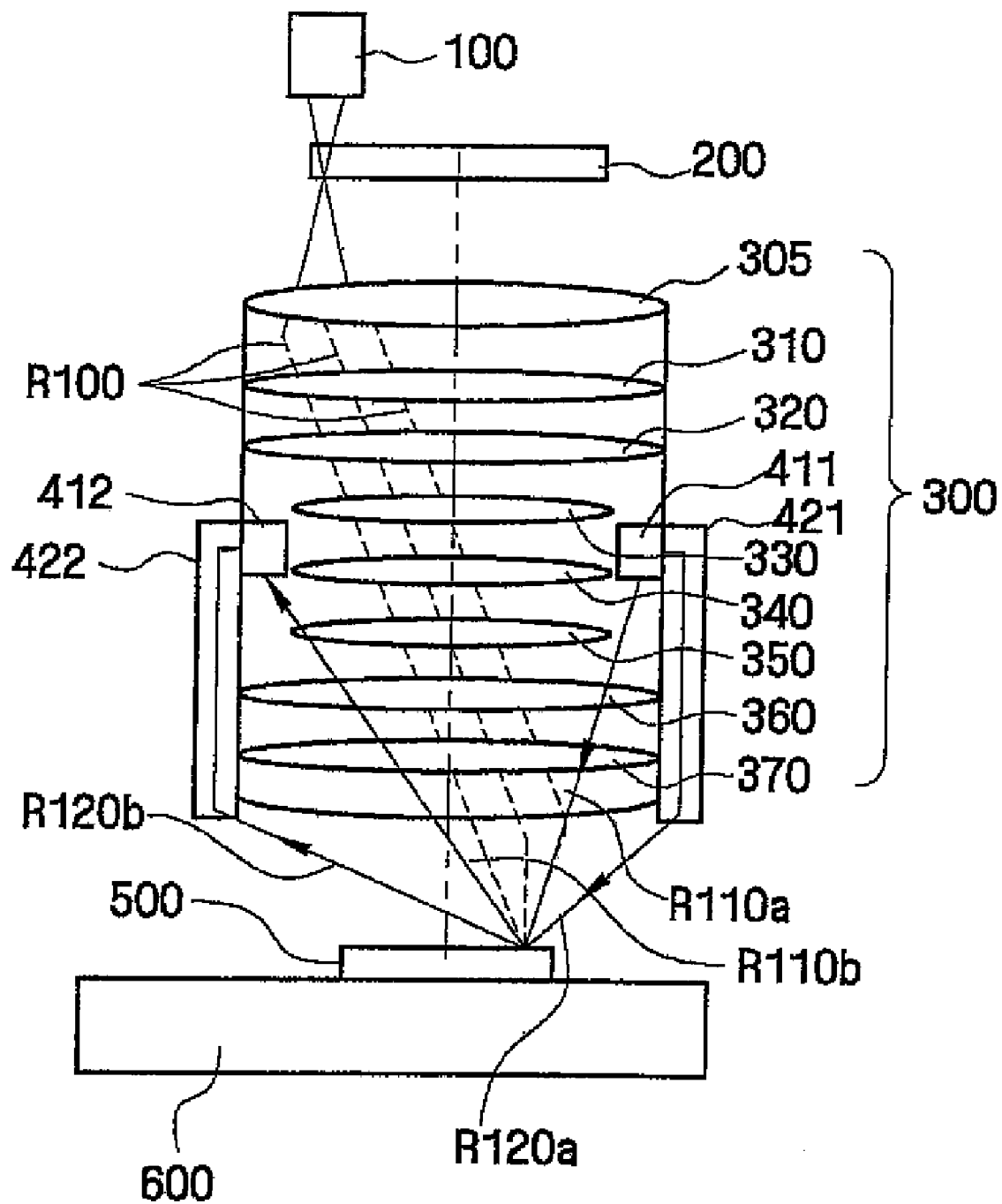
FIG. 2 is a schematic sectional view showing an exposure apparatus used in an exposure process according to the embodiment of the present invention.

Consider, for example, the exemplary embodiment of an exposure apparatus shown in FIG. 2. In FIG. 2, the exposure apparatus comprises a light source 100 adapted to generate an exposure beam, a reticle 200, a projection lens unit 300, and a stage 600 holding semiconductor substrate 500.

Projection lens unit 300 comprises a projection lens 305 and a focus and level condition measuring unit. The focus and level condition measurement unit comprises a measurement light emitting unit 411, a reflected measurement light receiving unit 412, a reference light emitting unit 421, and a reflected reference light receiving unit 422.

Light source 100 provides an exposure beam R100 used the exposure process through reticle 200. In the illustrated example, projection lens unit 300 is located under reticle 200. Projection lens 305 of projection lens unit 300 includes in one embodiment a plurality of lenses 310, 320, 330, 340, 350, 360 and 370 adapted to project exposure beam R100 onto semiconductor substrate 500. That is, projection lens unit 300 ultimately miniaturizes and accurately transfers a patterned light beam corresponding to a desired circuit pattern, as provided by reticle 200, onto semiconductor substrate 500.

Measurement light emitting unit 411 is incorporated into projection lens unit 300 and may be formed, for example, on an inner sidewall of projection lens 305. Measurement light emitting unit 411 projects measurement light R110a onto semiconductor substrate 500 via one or more of the plurality of lenses 310 through 370. A light emitting diode (LED) or laser diode (LD) may be used to form measurement light emitting unit 411. The LED or LD may have a wavelength in a range of from 400 nm to 800 nm or more, (e.g., a wavelength in the visible or infrared portions of the light spectrum). The selection of a measurement light wavelength is entirely a matter of design choice, but the foregoing range works well with conventional photoresist compositions which do not typically react with light at wavelengths in this range.

Reference light emitting unit 421 may be advantageously formed on an outer surface of projection lens 305. Reference light emitting unit 421 transmits reference light R120a onto semiconductor substrate 500. However, reference light R120a irradiates semiconductor substrate 500 without passing through any one of the plurality of lenses 310 through 370.

In one embodiment, a single light emitting device may act as both measurement light emitting unit 411 and reference light emitting unit 421. For example, using conventionally understood optical elements, a single light beam may be divided to provide the measurement light R110a and the reference light R120a. A waveguide structure may be used to implement reference light emitting unit 421, in which the reference light is effectively emitted using a total internal reflection of the waveguide structure.

The reflected reference light receiving unit 422 may be formed on the outer surface of projection lens 305 at a point conveniently located to receive portions of reference light R120b reflected from semiconductor substrate 500. For example, the reflected reference light receiving unit 422 is opposite the reference light emitting unit 421 in the illustrated embodiment. A common optical-to-electrical signal conversion element may be used to implement reflected reference light receiving unit 422 and reflected measurement light receiving unit 412. A waveguide structure may be used to implement reference light receiving unit 422 in which the total internal reflection of the waveguide structure is used to communicate the received reflected portion of reference light R120b.

In one embodiment, measurement light receiving unit 412 may be formed at a particular position on the inner side of projection lens 305. This particular position corresponds to a position at which portions of measurement light R110b reflected from semiconductor substrate 500 may be conveniently received after first passing through lenses 310 through 370 forming projection lens 305.

For example, measurement light receiving unit 412 may be opposite to measurement light emitting unit 411, as shown in the illustrated example. Where implemented in a common element, measurement light receiving unit 412 may detect reflected measurement light R110b after it passes through lenses 310 through 370 of projection lens 305, and may also detect the reflected reference light R120b. A charge transfer device sensor, a PIN diode, and/or an Avalanche Photo Diode (APD) may be used to form measurement light receiving unit 412 and/or reference light receiving unit 422.

Semiconductor substrate stage 600 operates in large measure like the conventional stage previously discussed. That is, it supports semiconductor substrate 500 and is adapted to precisely move in the X-, Y- and Z-directions, such that semiconductor substrate 500 is accurately positioned under projection lens unit 300.

In relation to the illustrated example, the focus and level conditions associated with the positioning of semiconductor 500 under projection lens 300 may be determined by comparing the intensity of measurement light R110b reflected from the four corners of the shot area, as reflected from semiconductor substrate 500 after passing through projection lens 305 with the intensity of the reference light R120b reflected from the four corners of shot area as reflected from semiconductor substrate 500 without passing through the projection lens 305. This comparison may form the basis for a control signal adapted to adjust the positioning of semiconductor substrate stage 600 in the X-, Y- and Z-directions to correct focus and/or level errors. Since the determined focus and level conditions for the semiconductor substrate are measured in relation to focus errors related to the actual operating condition of projection lens, and distortion errors related to the actual magnification effects of the projection lens, the focus and level conditions may be accurately determined and the positioning of the semiconductor substrate adjusted accordingly.

The exemplary embodiment includes projection lens 305 comprising a first plurality (N) of lenses (e.g., 310 through 370). In a related aspect, measurement light emitting unit 411 may be positioned such that measurement light R110a passes through only a second plurality (M) of the lenses, where M is equal to or less than N. The second plurality of lenses (M) should be sufficient in number such that measurement light R110a provides an accurate indication regarding the actual state of focus and level conditions related to the first plurality of lenses (e.g., 310 through 370). However, where the second plurality of lenses includes too many of the first plurality of lenses small (but acceptable) variations in the focus and level condition feedback condition may cause excessive adjustments to stage 600.

In certain preferred embodiments of the invention, the ratio of M to N is less than or equal to $3/4$, but greater or equal to $1/4$. With reference to the illustrated embodiment, measurement light emitting unit 411 may be located such that measurement light R110a passes through $1/2$ the first plurality (N) of lenses 310 to 370. In similar vein, at least in the case of the illustrated embodiment, measurement light receiving unit 412 may be located as high (e.g., vertically disposed in the illustrated orientation) up the structure of projection lens 305 as the measurement light emitting unit 411. More generally, however, measurement light receiving unit 412 should be located to properly detect portions of measurement light R110b reflected by semiconductor substrate 500 after passing through the second plurality of lenses (e.g., some number selected from 310 to 370 of projection lens 305).

The intensity comparison calculation described above in relation to the measurement light and reference light may be adjusted in embodiments wherein the measurement light passes through the second plurality of lenses. For example, the intensity of reference light R120b reflected from semiconductor substrate 500 may be taken or modified to express an average reference value and the resulting intensity of the measurement light may be compared in variable relationship to this average value based on the actual number of lenses it passes through. Alternatively or additionally, the initial relative intensities of the measurement and reference lights may be modified or calibrated to provide a clear comparison outcome.

For example, an ideal relationship between the intensity of measurement light R110a passing through projection lens 305 and the intensity of reference light R120a may be established at unity (e.g., the expected received intensities are the same). In this situation, errors in the detected focus and level conditions may be effectively determined by a comparison of these respective intensities resulting in a non-unity outcome within prescribed tolerances. More specifically, as one example, semiconductor substrate stage 600 may be moved in the X-, Y- and Z-directions such that the comparison difference between the intensities of reflected reference light R120b and reflected measurement light R110b falls within a predetermined range of +/−10%. In this manner, the actual, detected, focus and level conditions associated with semiconductor substrate 500 as positioned under projection lens 300 may be corrected.

In another embodiment, reference light emitting unit 421 may be moved from the position illustrated in FIG. 2 (e.g., a position proximate measurement light emitting unit 411) to an end position of projection lens 305 proximate semiconductor substrate 500. So positioned, the reference light R120a emitted from reference light emitting unit 421 may remain unaffected by any of the lenses forming (e.g., 310 to 370) forming projection lens 305. Where this arrangement is desired, the reflected reference light receiving part 422 will probably be similarly (e.g., symmetrically) moved away from reflected measurement light receiving unit 412 and positioned at the end of projection lens 305 proximate semiconductor substrate 500.

Figure 3:
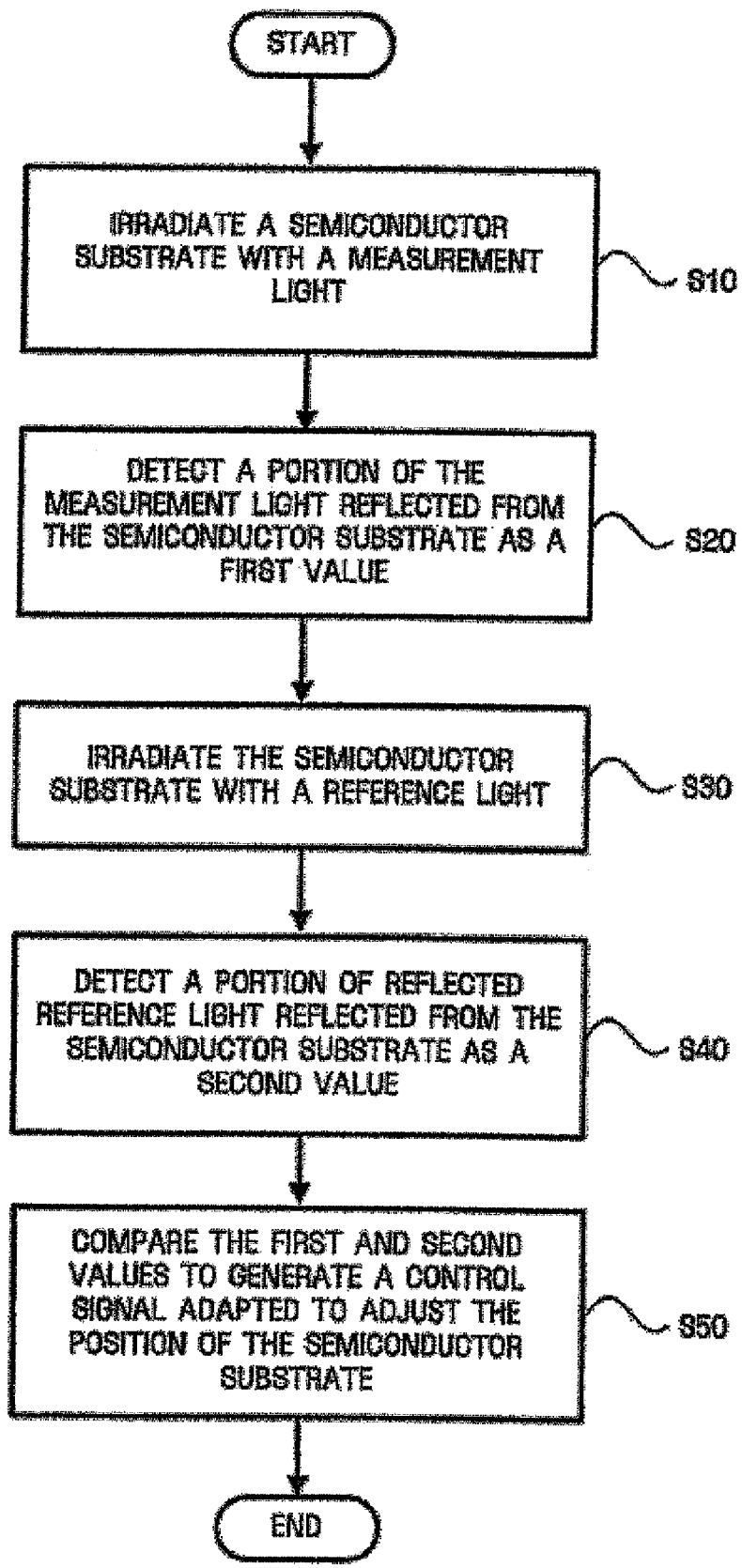
FIG. 3 is a flowchart illustrating a focused and leveled condition controlling method used in the exposure process according to the embodiment of the present invention.

An exemplary focus and level condition control method adapted for use with an exposure apparatus like the one illustrated in FIG. 2 will now be described with reference to FIGS. 2 and 3.

First, semiconductor substrate 500 is irradiated through some portion of projection lens 305 with measurement light R110a provided by measurement light emitting unit part 411 (S10). Then, a portion of measurement light R110b reflected from semiconductor substrate 500 is detected in reflected measurement light receiving unit 412 (S20). Next, semiconductor substrate 500 is irradiated with reference light R120a provided by reference light emitting unit 421 (S30).

A portion of reference light R120b reflected from semiconductor substrate 500 is then detected in reflected reference light receiving unit 422 (S40). Specifically, the portion of reflected reference light R120b may be detected in reflected measurement light receiving unit 412 via reflected reference light receiving unit 422. Intensity values (e.g., corresponding electrical signals) associated with the received portions of the measurement light and reference light are conventionally derived. Finally, these intensity values are compared and a corresponding control signal is conventionally derived (S50). Semiconductor substrate stage 600 may be moved in the X-, Y- and Z-directions such that the difference between the intensity values is minimized or falls with a predetermined tolerance range. In this manner, actual focus and level conditions related to the positioning of semiconductor substrate 500 under projection lens 305 are optimized or improved.

Of note, the foregoing example is not step order specific as between steps S10/S20 and S30/S40. Clearly, the reference light intensity value may be obtained after, before, or even simultaneously with the obtaining of the measurement light intensity value.

Using the foregoing control method and similar method embodiments of the invention, the focus and level conditions related to actual conditions associated with a projection lens units having adjustable properties may be determined and used to correct the relative positioning of a semiconductor substrate under the projection lens unit prior to a processing shot. The foregoing embodiments use the intensity of detected reference light and measurement light, but other optical features such as phase, polarization, wavelength, and/or frequency might be used to derive the control signal adapted to correct for focus and level errors. In similar vein, the foregoing embodiments adjusted the position of a semiconductor substrate stage, but the control signal might alternatively or additionally adjust the positioning of the projection lens unit or one or more constituent lens within the projection lens unit.

Because embodiments of the invention compensate for actual focus and level conditions, distortion and magnification errors associated with the conventional projection lens unit are effectively mitigated. Circuit patterns later formed on the subject semiconductor substrate are notably more accurate.

While the present invention has been particularly shown and described with reference to exemplary embodiments thereof, it will be understood by those of ordinary skill in the art that various changes in form and details may be made therein without departing from the scope of the present invention as defined by the following claims.

What is claimed is:

1. A focus and level condition control method adapted for use with a projection lens unit comprising a first plurality of lenses, wherein N is the number of lenses in the first plurality of lenses, the method comprising:

irradiating a semiconductor substrate positioned under the projection lens with a measurement light after passing the measurement light through at least a second plurality of the lenses in the projection lens unit, wherein M is the number of lenses in the second plurality of lenses, wherein N is greater than or equal to M, and detecting a portion of the measurement light reflected from the semiconductor substrate as a first intensive value;

irradiating the semiconductor substrate with a reference light without passing the reference light through any one of the first plurality of the lenses in the projection lens unit, and detecting a portion of the reference light reflected from the semiconductor substrate as a second intensive value;

comparing the first and second intensive values to generate a control signal adapted to adjust the position of the semiconductor substrate under the projection lens to compensate for focus and level condition errors; and wherein divergence of the first and second intensity values from being identical indicates variation in a desired focus and level condition.

2. The method of claim 1, wherein in a ratio of M to N ranges from about ¼ to about ¾.

3. The method of claim 2, wherein the projection lens unit is adapted to focus an exposure beam of first wavelength on the semiconductor substrate and wherein the measurement light has a second wavelength different from the first wavelength and the reference light has a third wavelength different from the first wavelength.

4. The method of claim 3, wherein in the second and third wavelengths are wavelengths in the visible light or the infrared light spectra.

5. The method of claim 1, where the first and second intensive values are related to the intensity of the measurement light and reference light respectively.

6. The method of claim 1, wherein the reflected measurement light passes through the second plurality of the lenses (M), which is the same as for the measurement light, to detect as the first intensive value.

7. The method of claim 1, wherein one intensity value of the reference light and another intensity value of the measurement light are identical.

* * * * *